(12) United States Patent
Millette et al.

(10) Patent No.: US 7,837,513 B2
(45) Date of Patent: Nov. 23, 2010

(54) TELECOMMUNICATIONS CONNECTOR

(75) Inventors: Luc Millette, Montreal (CA); Michel Bohbot, Montreal (CA); Gilles Sigouin, Chambly (CA); Virak Siev, Pointe-Claire (CA)

(73) Assignee: Belden CDT (Canada) Inc., Saint-Laurent (CA)

( * ) Notice: Subject to any disclaimer, the term of this patent is extended or adjusted under 35 U.S.C. 154(b) by 64 days.

(21) Appl. No.: 10/543,947

(22) PCT Filed: Apr. 19, 2005

(86) PCT No.: PCT/CA2005/000588
§ 371 (c)(1),
(2), (4) Date: Aug. 1, 2005

(87) PCT Pub. No.: WO2005/101579
PCT Pub. Date: Oct. 27, 2005

(65) Prior Publication Data
US 2008/0132123 A1 Jun. 5, 2008

Related U.S. Application Data

(60) Provisional application No. 60/562,992, filed on Apr. 19, 2004.

(30) Foreign Application Priority Data
Apr. 19, 2004 (CA) .................................. 2464834

(51) Int. Cl.
*H01R 24/00* (2006.01)
(52) U.S. Cl. .................................................... 439/676
(58) Field of Classification Search ................ 439/676, 439/941, 76.1, 248, 955
See application file for complete search history.

(56) References Cited

U.S. PATENT DOCUMENTS

| 4,292,477 A | 9/1981 | Adams et al. |
| 4,367,908 A | 1/1983 | Johnston |
| 4,413,469 A | 11/1983 | Paquin |

(Continued)

FOREIGN PATENT DOCUMENTS

| CA | 2321919 A1 | 10/1999 |

(Continued)

*Primary Examiner*—Edwin A. Leon
(74) *Attorney, Agent, or Firm*—Goudreau Gage Dubuc; Hugh Mansfield

(57) ABSTRACT

A contact element and mechanism for use in a connector, the connector comprising a socket adapted for receiving a cable plug comprising a terminal contact. The contact element and mechanism comprise a flexible dielectric substrate and a first conductive strip on a first surface of the substrate. When the plug is inserted into the socket, the terminal contact comes into contact with the conductive strip.

There is also provided a compensating connector for interconnection with a cable plug, the plug comprising a plurality of terminal contacts. The connector comprises a socket adapted for receiving the plug, a plurality of contact elements disposed in the socket, each of the contact elements comprising a conductive strip, and a compensation network comprised of a plurality of compensating elements. Each of the compensating elements is located adjacent to one of the contact elements. When the plug is inserted into the socket, each of the terminal contacts comes into contact with a predetermined one of the conductive strips.

16 Claims, 10 Drawing Sheets

U.S. PATENT DOCUMENTS

| | | | |
|---|---|---|---|
| 4,720,269 A | 1/1988 | Haskins et al. | |
| 4,831,497 A | 5/1989 | Webster et al. | |
| 4,850,887 A | 7/1989 | Sugawara | |
| 5,110,304 A | 5/1992 | Kjeldahl | |
| 5,186,647 A | 2/1993 | Denkmann et al. | |
| 5,269,708 A | 12/1993 | DeYoung et al. | |
| 5,282,754 A | 2/1994 | Kish et al. | |
| 5,295,869 A | 3/1994 | Siemon et al. | |
| 5,299,956 A | 4/1994 | Brownell et al. | |
| 5,310,363 A | 5/1994 | Brownell et al. | |
| 5,326,284 A | 7/1994 | Bohbot et al. | |
| 5,358,414 A | 10/1994 | Kish et al. | |
| 5,362,254 A | 11/1994 | Siemon et al. | |
| 5,362,257 A | 11/1994 | Neal et al. | |
| 5,399,106 A | 3/1995 | Ferry | |
| 5,399,107 A | 3/1995 | Gentry et al. | |
| 5,403,200 A | 4/1995 | Chen | |
| 5,411,414 A | 5/1995 | House et al. | |
| 5,414,393 A | 5/1995 | Rose et al. | |
| 5,431,584 A | 7/1995 | Ferry | |
| 5,431,586 A | 7/1995 | Klas et al. | |
| 5,432,484 A | 7/1995 | Klas et al. | |
| 5,454,738 A | 10/1995 | Lim et al. | |
| 5,459,643 A | 10/1995 | Siemon et al. | |
| 5,470,244 A | 11/1995 | Lim et al. | |
| 5,474,474 A | 12/1995 | Siemon et al. | |
| 5,488,201 A | 1/1996 | Liu | |
| 5,501,617 A | 3/1996 | Arnett | |
| 5,513,065 A | 4/1996 | Caveney et al. | |
| 5,547,405 A | 8/1996 | Pinney et al. | |
| 5,549,479 A * | 8/1996 | Elco et al. | 439/67 |
| 5,562,479 A | 10/1996 | Pallas et al. | |
| 5,580,270 A | 12/1996 | Pantland et al. | |
| 5,586,914 A | 12/1996 | Foster, Jr. et al. | |
| 5,593,314 A | 1/1997 | Lincoln | |
| 5,626,497 A | 5/1997 | Bouchan et al. | |
| 5,639,266 A | 6/1997 | Patel | |
| D382,274 S | 8/1997 | Lo et al. | |
| 5,673,009 A | 9/1997 | Klas et al. | |
| 5,700,167 A | 12/1997 | Pharney et al. | |
| 5,762,516 A | 6/1998 | Itoga et al. | |
| 5,779,503 A | 7/1998 | Tremblay et al. | |
| 5,791,943 A | 8/1998 | Lo et al. | |
| 5,797,764 A | 8/1998 | Coulombe et al. | |
| 5,921,818 A | 7/1999 | Larsen et al. | |
| 5,924,896 A | 7/1999 | Arnett et al. | |
| 5,931,703 A | 8/1999 | Aekins | |
| 5,938,479 A | 8/1999 | Paulson et al. | |
| 5,940,959 A | 8/1999 | Caveney et al. | |
| 5,944,535 A | 8/1999 | Bullivant et al. | |
| 5,947,772 A | 9/1999 | Arnett et al. | |
| 5,961,354 A | 10/1999 | Hashim | |
| 5,967,853 A | 10/1999 | Hashim | |
| 5,967,854 A | 10/1999 | Craig | |
| 5,975,919 A | 11/1999 | Arnett et al. | |
| 5,997,358 A | 12/1999 | Adriaenssens et al. | |
| 6,017,229 A | 1/2000 | Tulley et al. | |
| 6,023,200 A | 2/2000 | Rhee | |
| 6,042,427 A | 3/2000 | Adriaenssens et al. | |
| 6,056,568 A | 5/2000 | Arnett | |
| 6,057,512 A | 5/2000 | Noda et al. | |
| 6,066,005 A | 5/2000 | Belopolsky | |
| 6,074,256 A | 6/2000 | Arnett | |
| 6,079,996 A | 6/2000 | Arnett | |
| 6,086,428 A | 7/2000 | Pharney et al. | |
| 6,089,923 A | 7/2000 | Phommachanh | |
| 6,099,357 A | 8/2000 | Reichle | |
| 6,102,730 A | 8/2000 | Kjeldahl et al. | |
| 6,109,943 A | 8/2000 | Arnett | |
| 6,113,400 A | 9/2000 | Martin et al. | |
| 6,113,418 A | 9/2000 | Kjeldahl | |
| 6,116,964 A | 9/2000 | Goodrich et al. | |
| 6,116,965 A | 9/2000 | Arnett et al. | |
| 6,120,329 A | 9/2000 | Steinman | |
| 6,132,266 A | 10/2000 | Klas et al. | |
| 6,139,343 A | 10/2000 | Arnett | |
| 6,162,089 A | 12/2000 | Costello et al. | |
| 6,165,023 A | 12/2000 | Troutman et al. | |
| 6,168,458 B1 | 1/2001 | Kraft | |
| 6,168,472 B1 | 1/2001 | Arnett | |
| 6,176,742 B1 | 1/2001 | Arnett et al. | |
| 6,186,834 B1 | 2/2001 | Arnett et al. | |
| 6,186,836 B1 | 2/2001 | Ezawa et al. | |
| 6,193,526 B1 | 2/2001 | Milner et al. | |
| 6,196,880 B1 | 3/2001 | Goodrich et al. | |
| 6,224,427 B1 | 5/2001 | Goodrich | |
| 6,231,397 B1 | 5/2001 | de la Borbolla et al. | |
| 6,234,836 B1 | 5/2001 | Schmidt et al. | |
| 6,244,906 B1 | 6/2001 | Hashim et al. | |
| 6,244,907 B1 | 6/2001 | Arnett | |
| 6,267,628 B1 | 7/2001 | Meckley et al. | |
| 6,270,381 B1 | 8/2001 | Adriaenssens et al. | |
| 6,280,231 B1 | 8/2001 | Nicholls | |
| 6,280,256 B1 | 8/2001 | Belopolsky et al. | |
| 6,331,126 B1 | 12/2001 | Wagner | |
| 6,334,781 B1 | 1/2002 | Nishio et al. | |
| 6,334,792 B1 | 1/2002 | Schmidt et al. | |
| 6,336,826 B1 | 1/2002 | Kraft | |
| 6,338,643 B1 | 1/2002 | Miller et al. | |
| 6,346,010 B1 | 2/2002 | Emplit | |
| 6,350,158 B1 | 2/2002 | Arnett et al. | |
| 6,354,865 B1 | 3/2002 | Bogese | |
| 6,371,793 B1 | 4/2002 | Doorhy et al. | |
| 6,379,157 B1 * | 4/2002 | Curry et al. | 439/676 |
| 6,394,835 B1 | 5/2002 | Milner et al. | |
| 6,394,844 B1 | 5/2002 | Frias Valero et al. | |
| 6,394,854 B1 | 5/2002 | Belopolsky et al. | |
| D458,591 S | 6/2002 | Chang | |
| 6,402,560 B1 | 6/2002 | Lin | |
| 6,409,547 B1 | 6/2002 | Reede | |
| 6,428,362 B1 | 8/2002 | Phommachanh | |
| 6,443,777 B1 | 9/2002 | McCurdy et al. | |
| 6,447,326 B1 | 9/2002 | Teach et al. | |
| 6,464,529 B1 | 10/2002 | Jensen et al. | |
| 6,464,541 B1 | 10/2002 | Hashim et al. | |
| 6,468,090 B2 | 10/2002 | Belopolsky et al. | |
| 6,509,807 B1 | 1/2003 | Anthony et al. | |
| 6,511,344 B2 | 1/2003 | Winings | |
| 6,520,806 B2 | 2/2003 | Phommachanh | |
| 6,520,808 B2 | 2/2003 | Forbes et al. | |
| 6,524,131 B2 | 2/2003 | Schmidt et al. | |
| 6,530,810 B2 | 3/2003 | Goodrich et al. | |
| 6,554,650 B2 | 4/2003 | Kayworth et al. | |
| 6,554,653 B2 | 4/2003 | Henneberger | |
| 6,575,778 B1 | 6/2003 | Milette et al. | |
| 6,579,116 B2 | 6/2003 | Brennan et al. | |
| 6,602,097 B1 | 8/2003 | Patel | |
| 6,606,011 B2 | 8/2003 | Anthony et al. | |
| 6,612,877 B2 | 9/2003 | Hyland | |
| 6,629,862 B2 | 10/2003 | Schmidt et al. | |
| 6,641,443 B1 | 11/2003 | Itano et al. | |
| 6,650,525 B2 | 11/2003 | Anthony | |
| 6,663,436 B1 | 12/2003 | Arnett et al. | |
| 6,736,681 B2 | 5/2004 | Arnett | |
| 6,744,329 B2 | 6/2004 | Nguyen | |
| 6,746,283 B2 | 6/2004 | Arnett et al. | |
| 6,749,466 B1 | 6/2004 | Milner et al. | |
| 6,758,698 B1 | 7/2004 | Caveney et al. | |
| 6,769,936 B2 | 8/2004 | Gutierrez et al. | |
| 6,786,776 B2 | 9/2004 | Itano et al. | |
| 6,796,847 B2 | 9/2004 | AbuGhazaleh et al. | |
| 6,802,743 B2 | 10/2004 | Aekins et al. | |
| 6,814,624 B2 | 11/2004 | Clark et al. | |
| 6,816,025 B2 | 11/2004 | Nguyen | |

| | | |
|---|---|---|
| 6,821,128 B2 | 11/2004 | Belopolsky et al. |
| 6,821,142 B1 | 11/2004 | Rayev et al. |
| 6,840,816 B2 | 1/2005 | Aekins |
| 6,843,657 B2 | 1/2005 | Driscoll et al. |
| 6,848,947 B2 | 2/2005 | Chimiak |
| 6,873,513 B2 | 3/2005 | Anthony |
| 6,893,296 B2 | 5/2005 | Aekins et al. |
| 6,894,884 B2 | 5/2005 | Anthony, Jr. et al. |
| 6,896,557 B2 | 5/2005 | Aekins et al. |
| 6,910,897 B2 | 6/2005 | Driscoll et al. |
| 2001/0016455 A1 | 8/2001 | Reichle |
| 2002/0177366 A1 | 11/2002 | Hyland |
| 2002/0177368 A1 | 11/2002 | Hyland |
| 2002/0177369 A1 | 11/2002 | Hyland |
| 2003/0186591 A1* | 10/2003 | Jensen et al. ............... 439/676 |
| 2004/0082227 A1 | 4/2004 | Hashim |

FOREIGN PATENT DOCUMENTS

| | | |
|---|---|---|
| DE | 196 29 918 A1 | 1/1998 |
| EP | 1 014 513 A | 6/2000 |
| EP | 1 414 115 A1 | 4/2004 |
| GB | 2271678 A | 4/1994 |
| JP | 10-209589 | 8/1998 |
| JP | 2001-068227 | 3/2001 |
| WO | WO-99/53574 A1 | 10/1999 |

* cited by examiner

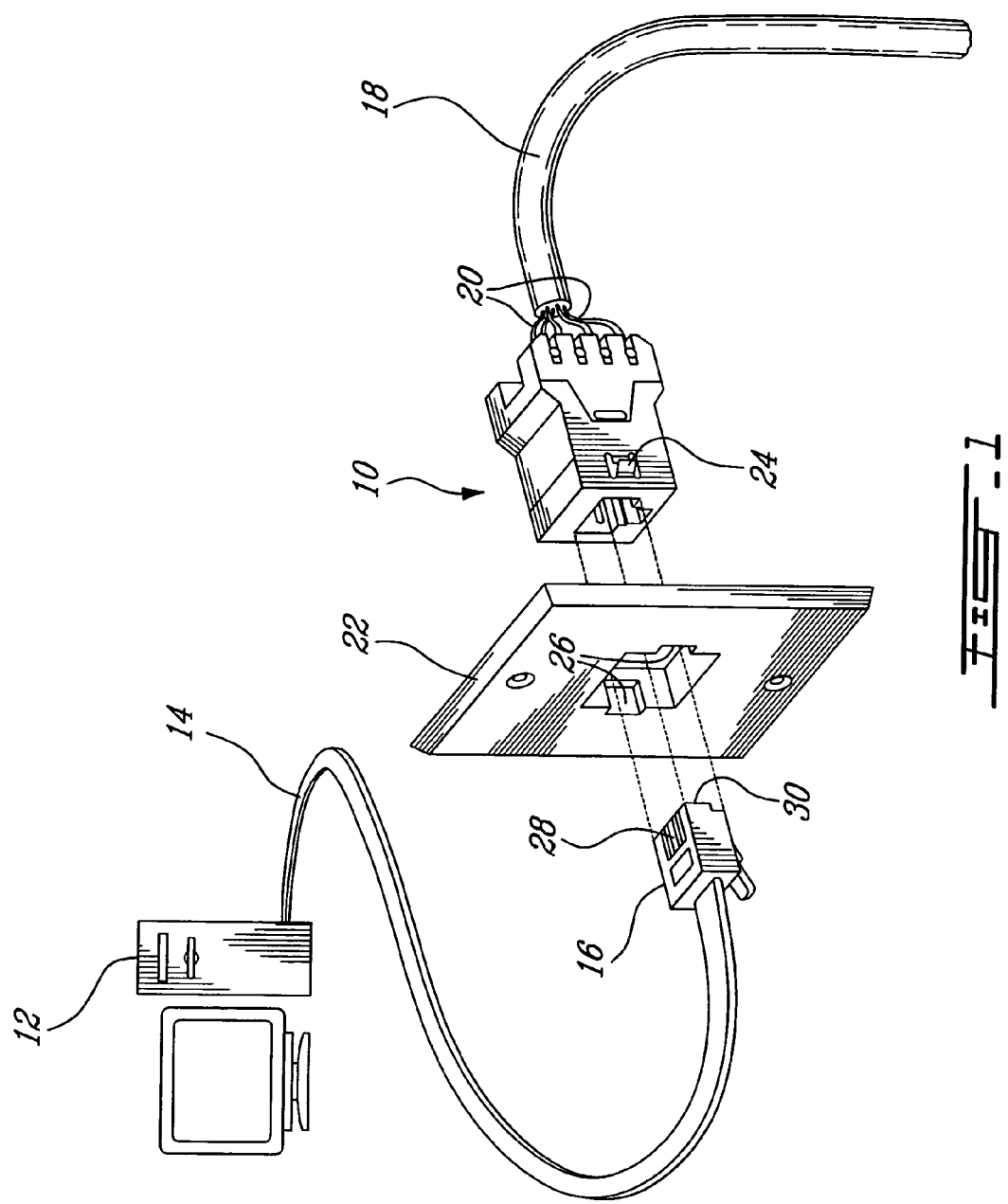

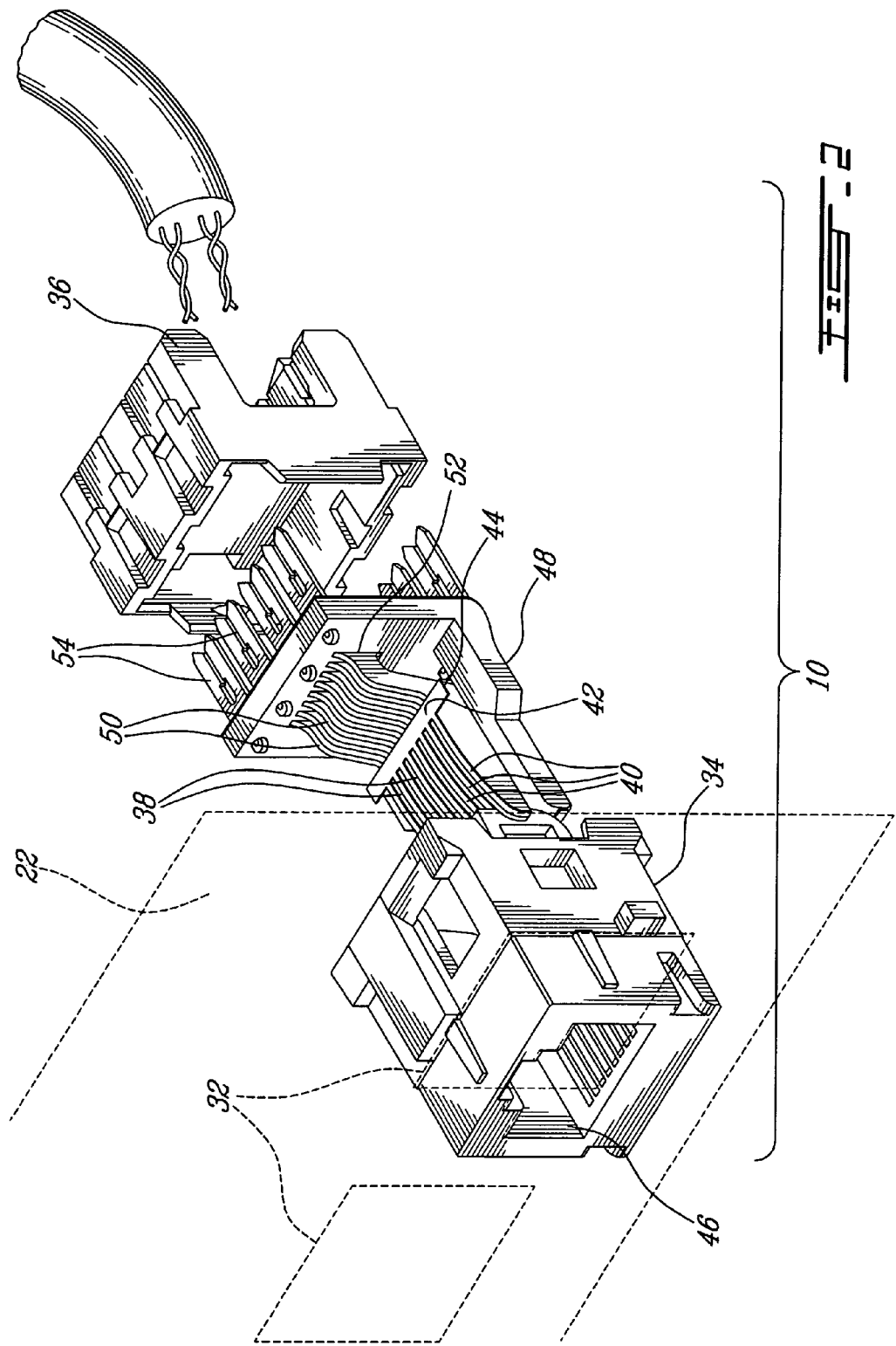

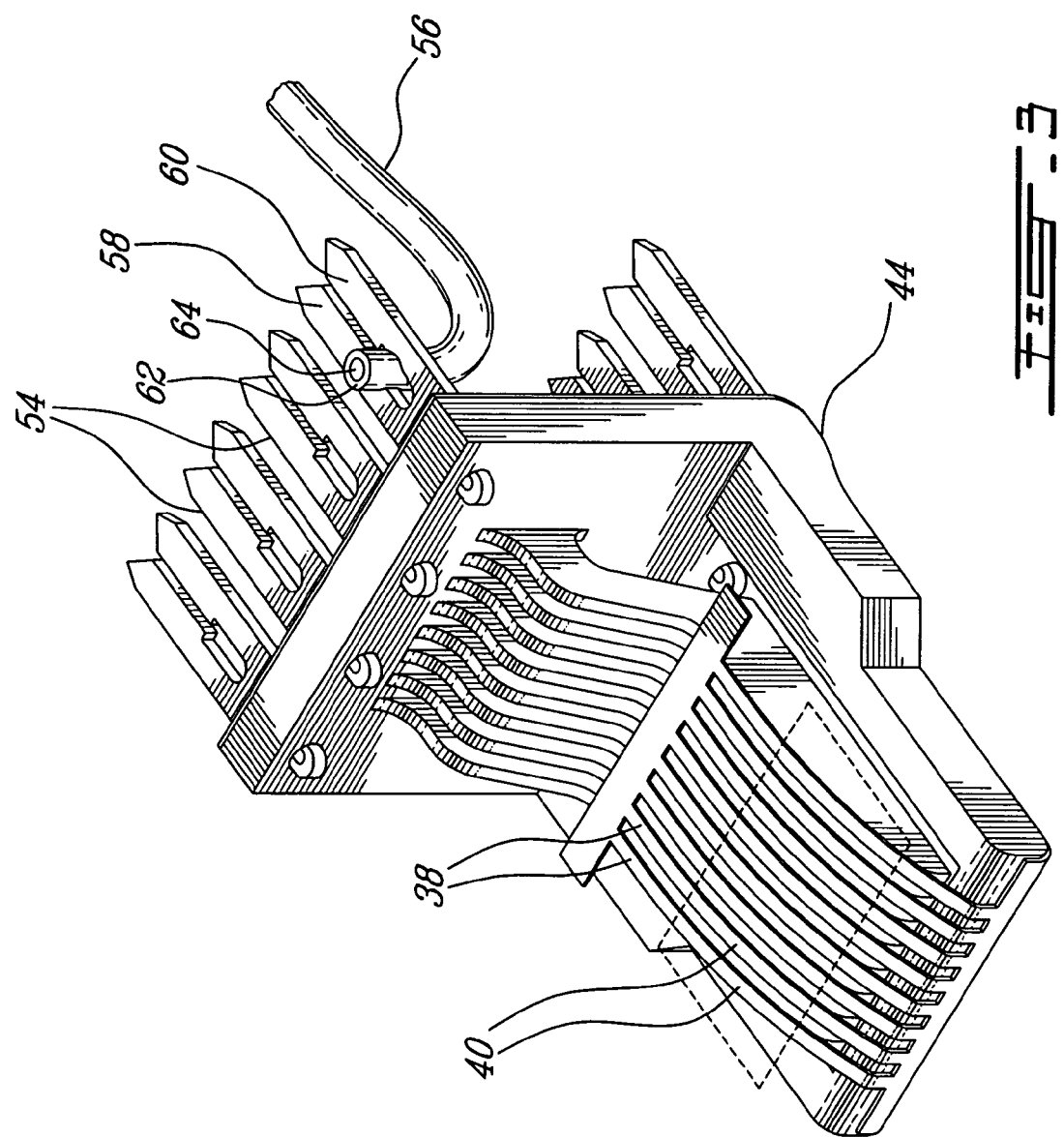

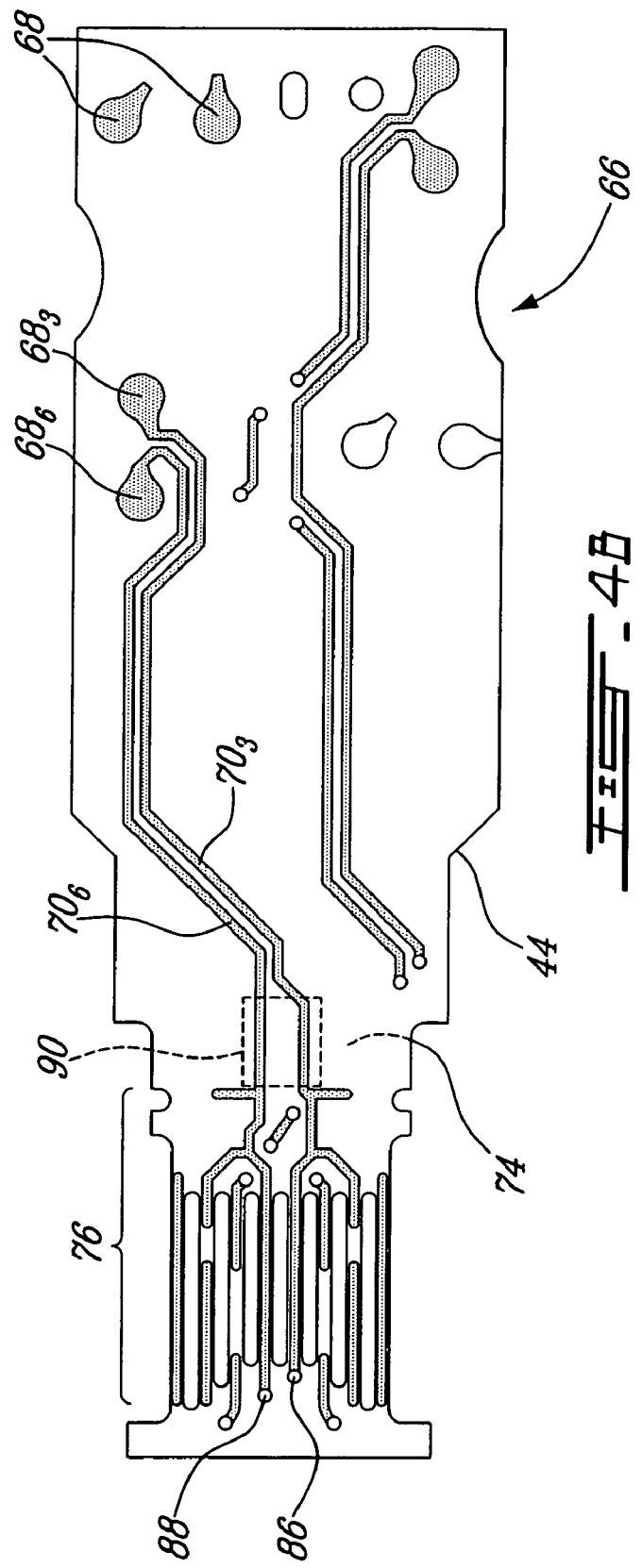

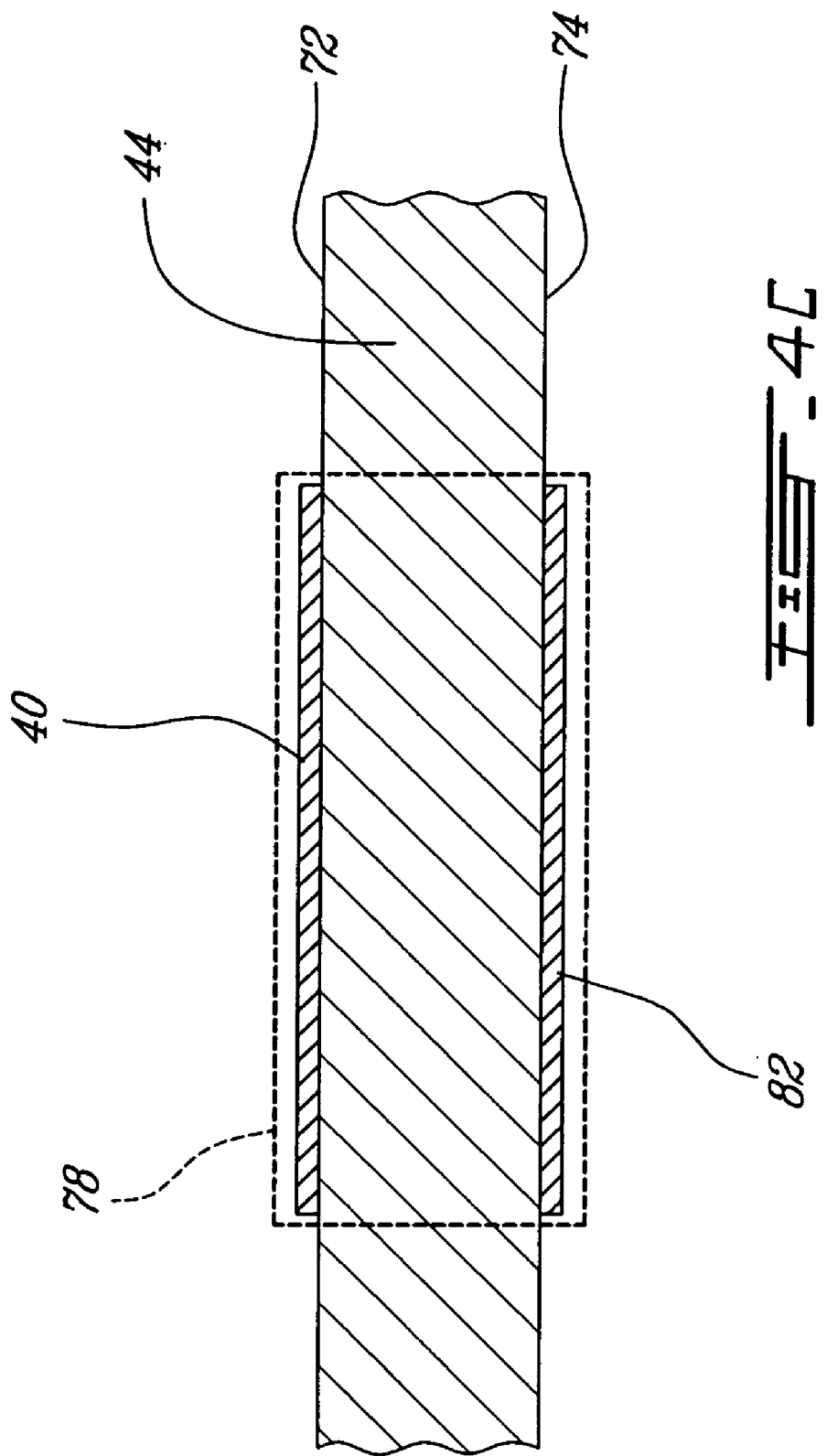

TELECOMMUNICATIONS CONNECTOR

The present invention claims the benefit of a commonly assigned provisional application entitled "Connector", which was filed on Apr. 19, 2004 and assigned Ser. No. 60/562,992. The entire contents of the foregoing provisional patent application are hereby incorporated by reference.

FIELD OF THE INVENTION

The present invention relates to a telecommunications connector. In particular, the present invention relates to a telecommunications connector comprised of a plurality of contact points having a compensating element at the point of contact.

BACKGROUND TO THE INVENTION

Connectors, or connector jacks, are adapted to receive plugs for the interconnection of telecommunication cables and equipment, a good example thereof being connectors and plugs which conform to the ubiquitous RJ-45 standard. As known in the art, as the plug is inserted into the connector a series of terminal contacts exposed along an edge of the plug come into contact with a corresponding series of contact elements disposed in the connector housing. Each of the contact elements typically forms a portion of a rigid tine manufactured from a conductive material such as nickel or gold plated steel or the like. The individual tines are in turn mounted in an isolating support and include a bendable portion such that, as the terminal contacts come into contact with the contact elements the contact elements are retracted, while at the same bringing a countering force to bear to improve the interconnection.

As transmission bandwidths and transfer rates increase in data communication systems, compensation for crosstalk noise becomes increasingly important. As wiring and cabling structures and configurations are improved to satisfy the low noise requirements of these data transfer technologies, connectors terminating such transfer lines must also meet the same requirements.

Connectors conforming to the well-known RJ-45 standards are good examples of connectors being subject to crosstalk noise (NEXT: Near End Crosstalk, FEXT: Far End Crosstalk) between adjacent conductor pairs, as conductor pairs (usually four pairs) within such connectors are not symmetrically configured for all pair combinations. In order to fully compensate for common and differential mode crosstalk noise arising in signals transferred through such a plug/connector interface, in other words, for the above connector to operate in an optimal balanced mode, reactances between all conductors of each pair must be equal. Presently, pairs identified by the pins 3-6 and 4-5 are typically well balanced in prior art plugs and connectors, providing adequate compensation for common and differential mode noise between these pairs. On the other hand, the capacitive couplings between the pairs 1-2 and 3-6 and the pairs 3-6 and 7-8 are not equal for all conductors, which gives rise to, among others, mode conversion noise or crosstalk between the pairs (e.g. differential mode to common mode NEXT and vice-versa), a significant problem when attempting to comply with increasingly demanding industry standards.

The prior art reveals a variety of compensation networks and methods for mode conversion noise or crosstalk between pairs. However, one drawback of these prior art networks is that the compensating elements, be they inductive or capacitive, are located away from the point of contact between the terminal contacts of the plug and the contact elements of the connector.

SUMMARY OF THE INVENTION

The present invention addresses the above and other drawbacks by providing a contact element for use in a connector, the connector comprising a socket adapted for receiving a cable plug comprising a terminal contact. The contact element comprises a flexible dielectric substrate; and a first conductive strip on a first surface of the substrate. When the plug is inserted into the socket, the terminal contact comes into contact with the conductive strip.

Additionally there is provide a contact mechanism for use in a connector, the connector comprising a socket adapted to receive a plug comprising a plurality of terminal contacts. The mechanism comprises a flexible dielectric substrate, and a plurality of first conductive strips disposed on a first surface of the substrate, wherein when the plug is inserted into the socket, each of the terminal contacts comes into contact with a predetermined one of the conductive strips.

There is also provided a connector for interconnection with a cable plug, the plug comprising a plurality of terminal contacts. The connector comprises a socket adapted for receiving the plug, and a plurality of contact elements disposed in the socket, each of the elements comprised of a conductive strip on a first surface of a flexible dielectric substrate. When the cable plug is inserted into the socket, each of the terminal contacts comes into contact with a predetermined one of the contact strips.

Furthermore, there is provide a compensating connector for interconnection with a cable plug, the plug comprising a plurality of terminal contacts. The connector comprises a socket adapted for receiving the plug, a plurality of contact elements disposed in the socket, each of the contact elements comprising a conductive strip, and a compensation network comprised of a plurality of compensating elements, wherein each of the compensating elements is located adjacent to one of the contact elements. When the plug is inserted into the socket, each of the terminal contacts comes into contact with a predetermined one of the conductive strips.

Also, there is provided a contact element for use in a compensating connector, the connector comprising a socket adapted for receiving a cable plug comprising a terminal contact. The contact element comprises a dielectric support, and a compensating element comprising a conductive strip on a surface of the support. When the plug is inserted into the socket, the terminal contact comes into contact with the conductive strip.

Additionally, there is provide a compensating connector for interconnection with a cable plug terminating a telecommunications cable comprised of a plurality of conductors arranged in pairs, the plug comprising a plurality of terminal contacts terminating a predetermined one of the conductors. The connector comprises a socket adapted for receiving the plug, a plurality of contact elements disposed in the socket, each of the contact elements comprising a conductive strip, and a compensation network comprised of a plurality of compensating elements, wherein each of the compensating elements is located adjacent to one of the contact elements. When the plug is inserted into the socket, each of the terminal contacts comes into contact with a predetermined one of the conductive strips.

BRIEF DESCRIPTION OF THE FIGURES

FIG. 1 is a perspective view of an RJ-45 socket and plug assembly in accordance with an with an illustrative embodiment of the present invention;

FIG. 2 provides an exploded view of a connector in accordance with an illustrative embodiment of the present invention;

FIG. 3 provides a raised front perspective view of a support structure with flexible PCB attached in accordance with an illustrative embodiment of the present invention;

FIG. 4B provides a top view of the flexible PCB in FIG. 4A detailing the traces on a bottom surface of the PCB in accordance with an illustrative embodiment of the present invention;

FIG. 4C is a sectional view along 4C in FIG. 4A;

DETAILED DESCRIPTION OF THE ILLUSTRATIVE EMBODIMENTS

Figure 4A:
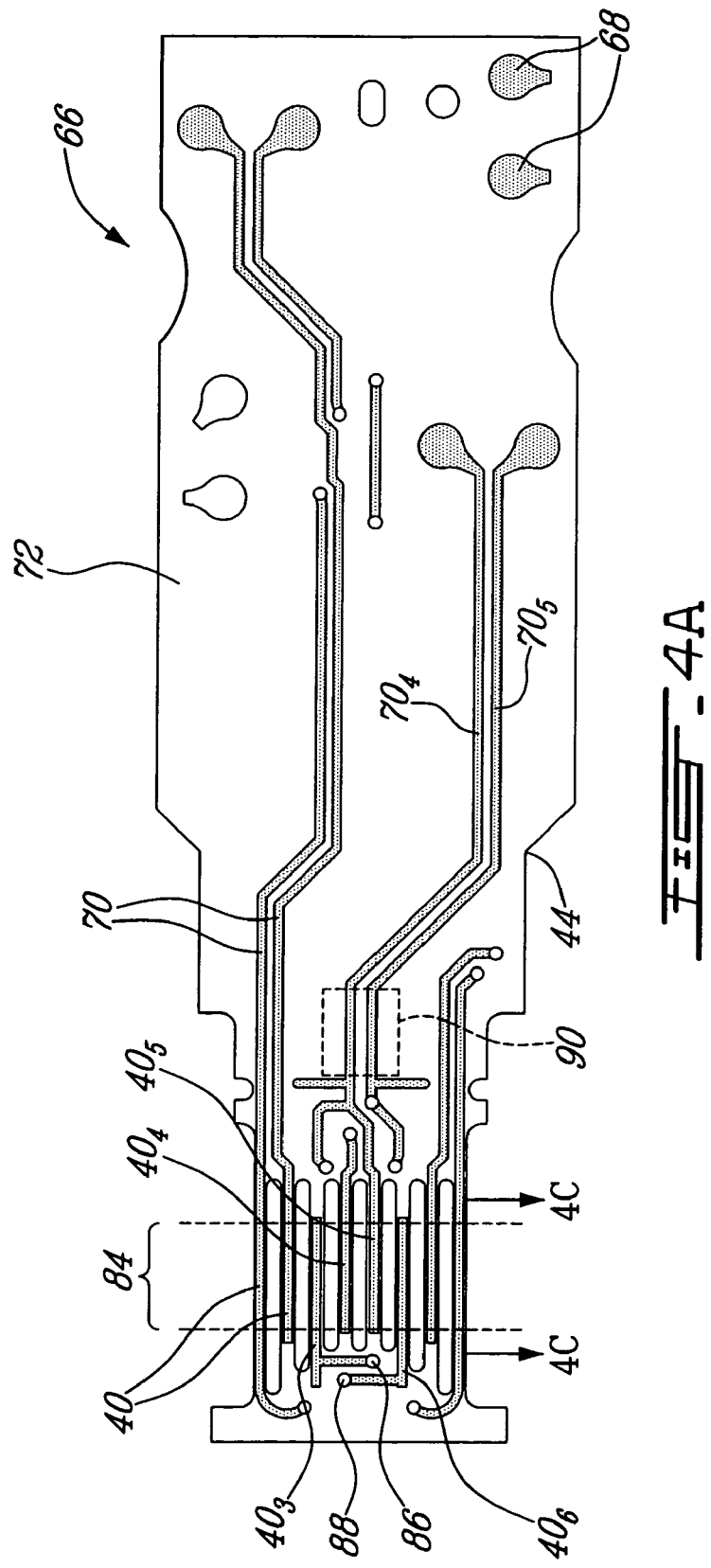
FIG. 4A provides a top view of a flexible PCB detailing the traces on a top surface of the PCB in accordance with an illustrative embodiment of the present invention.

Referring now to FIG. 1, an illustrative embodiment of a connector, generally referred to using the reference numeral 10, will now be described. As known in the art user equipment as in 12 typically gains access to a local area network (LAN) or the like (not shown) via a network cable 14 comprised of a plurality of twisted pairs of conductors (not shown). The network cable 14 is terminated by a plug 16 which is adapted for insertion into (and removal from) the connector 10. The connector 10 terminates a communications cable 18 which, at an opposite end, is terminated by other networking equipment such as switches, hubs, routers, repeaters and the like (all not shown). Both the network cable 14 and the communications cable 18 are comprised of typically the same number of twisted pairs of conductors as in 20.

Still referring to FIG. 1, the connector 10, which is typically mounted flush with a wall or the like (not shown) behind which the communications cable 18 is hidden, is inserted into a face plate 22 and retained securely therein by a pair of tabs 24 moulded or otherwise formed in an outer surface of the connector 10 which mate with similar interlocking portions 26 moulded into the face plate 22. For jacks and plugs which conform to the RJ-45 standard, a series of eight (8) connector contact strips (not shown) are disposed within the connector 10 which individually terminate the twisted pairs of conductors 20 of the communications cable 18. Similarly, the eight (8) conductors within the cable 14 are individually terminated by a series of eight (8) terminal contacts as in 28 exposed along a forward face 30 of the plug 14. When the plug 16 is inserted into the connector 10, the connector contact strips of the connector 10 are brought into contact with the terminal contacts 28 of the plug 16 thereby providing a conductive path between plug 16 and connector 10 and as a result, interconnecting the conductors of the cable 14 with those of the communications cable 18.

Referring now to FIG. 2, connectors as in 10 are typically modular and designed for snapping into a face plate (or panel) 22 provided with one or more cut away connector receptacles as in 32 therein, or alternatively for mounting directly on printed circuit boards or the like (not shown) as part of a larger circuit assembly. Illustratively, the connector 10 is comprised of a two part housing comprised of the forward part 34 and a rearward part 36 both manufactured from a suitable rigid non-conducting material such as plastic. A series of contact elements 38 comprised of contact strips 40 are disposed within the housing and enclosed therein when the forward part 34 is assembled to the rearward part 36. The series of contact strips 40 are illustratively etched on a first surface 42 of a Printed Circuit Board (PCB) 44 manufactured from a non-conductive (dielectric) and illustratively flexible material such as polymide, Kapton®, etc., and coated with a conductive material such as copper or aluminium to form a contact assembly. As known in the art, lithographic techniques can be used to selectively remove a surface layer of conductive material from a PCB leaving conductive traces supported by a non-conductive substrate. The exposed series of contact strips 40 are typically covered in a conductive material having high oxidation potential, such as gold.

As will now be apparent to those of ordinary skill in the art, as a cable plug (not shown) is inserted into the plug opening 46, each of the contacts within the cable plug will press against a complementary one of the series of contact strips 40. Given the flexible nature of the PCB 44, the series of contact strips 40 will tend to deflect away from the cable plug. In order to ensure that good contact is maintained between the contacts disposed within the plug and the series of contact strips 40, a rigid support structure 48, for example manufactured from a non-conductive material such as plastic, is provided around which the flexible PCB 44 is wrapped. A series of non-conductive supporting blades with limited flexibility as in 50 are mounted at a first end 52 to the support structure 48, each of the blades as in 50 positioned under one of the series of contact strips 40. The blades 50 provide an independent countering force tending to bias the series of contact strips 40 towards the contacts of the cable plug and thereby ensuring a reliable contact when the cable plug is inserted into the assembly 10. Additionally, to improve the flexibility of the series of contact strips 40 relative to one another, the material between adjacent contact strips 40 is removed during fabrication of the PCB 44.

Referring now to FIG. 3, each of the series of contact strips 40 is in contact with a particular Insulation Displacement Connector (IDC) terminal as in 54. As is known in the art, when a small gauge insulated wire as in 56 is inserted between the bifurcated conductive blades 58, 60 of an IDC terminal 54, an incision is made in the insulation 62 of the wire 56 allowing the conductive blades 58, 60 to come into contact with the conductor 64 of the wire 56.

Note that, although the present illustrative embodiment discloses the use of IDC terminals, alternatively the IDC terminals could be replaced with other types of terminals, for example rigid contact pins, thereby allowing the connector 10 to be soldered directly to a PCB or the like (not shown).

Referring now to FIG. 4A and FIG. 4B, a flexible contact assembly 66 will now be described. The series of contact strips 40 are interconnected with the contact pads as in 68 of the IDC terminals (54 in FIG. 3) via a series of traces as in 70 etched onto the first surface 72 and a second surface 74 of the PCB 44. Additionally, a compensating network 76 comprised of a series of selectively interconnected capacitive compensating elements is provided for.

Referring back to FIG. 1 in addition to FIGS. 4A and 4B, by adjusting the lays of the twisted pairs of conductors within the cables as in 14 and 18, and in some cases providing shielding between the twisted pairs of conductors, the design of the cables as in 14 and 18 has been optimised in order to minimise cross talk between the conductors. However, as is known in the art, elements such as connectors 10, cables 14, 18 and plugs 16 disturb this optimisation by introducing parasitic reactances into the transmission path of signals, thereby causing unbalanced behaviour in regards to cross talk, noise immunity, etc. which adversely affect the performance of a the communications system which these elements form part of. Additionally, untwisting the twisted pairs as well as the presence of metal contacts at the connector 10/plug 14 boundary also disturbs this optimisation and introduces stray or parasitic reactances which must be dealt with (or compensated for) if high data transfer rates are to be maintained. Also, adjacent conductors are coupled to one another to some degree and in this manner cross-talk is introduced into the communications signals. The compensating network 76 selectively couples the twisted pairs of conductors (reference 20 in FIG. 1) through the introduction of inductive and capacitive reactances which compensate for these parasitic reactances, thereby improving performance, especially at high frequencies, in terms of reduced cross talk, reduced noise, etc. As known in the art, such a compensation network can be formed by combinations of capacitive compensating elements and/or inductive compensating elements.

Referring now to FIG. 4C, each capacitive compensating element 78 is comprised of a first contact plate provided by the contact strip 40 etched into the first surface 72 of the PCB 44 and a second contact plate 82 which is etched onto the second surface 74 of the PCB 44. As will now be understood by a person of ordinary skill in the art, the combination of the dielectric material of the PCB 44 sandwiched between the contact strip 40 and the second contact plate 82 provides for a capacitive compensating element 78. One great advantage of this construction is that the compensating elements as in 78 are located at the point of contact between the connector 10 and plug (not shown) which in turn greatly improves the high frequency behaviour of the compensating network 76.

Referring back to FIGS. 4A and 4B, in order to provided for inductive compensating elements, overlapping inductive loops must be set up. As will be apparent to a person of ordinary skill in the art, the amount of inductive coupling will in part be a function of the area of overlap between overlapping inductive loops. Additionally, inductive coupling can be either forward or inverse, depending on the direction of current flowing in both the loops. Referring to FIG. 1 in addition to FIGS. 4A and 4B, when a plug 16 is inserted in the connector 10, the terminal contacts 28 will come into contact with predetermined ones of the contact strips 40 in the contact zone 84. In particular, a path will be set up between contact strip (or pin) 3 (reference $40_3$) and its associated contact pad $68_3$ via a through hole contact 86 and a trace $70_3$. Of note is that the path of the trace $70_3$ is above contact strip (or pin) 5 (reference $40_5$ on FIG. 4A). Similarly, a path will be set up between contact strip (or pin) 6 (reference $40_6$) and its associated contact pad $68_6$ via a through hole contact 88 and a trace $70_6$. Of note is that the path of the trace $70_6$ is above contact strip (or pin) 4 (reference $40_4$ on FIG. 4A). In this manner a pair of overlapping inductive loops is set up between pairs 3-6 and pairs 4-5 causing inductive coupling which is proportional to the space between pin 4 (reference $40_4$) and pin 5 (reference $40_5$). A similar inductive coupling is set up between the traces $70_4$, $70_5$ of pin pairs 4-5 (references $40_4$ and $40_5$) and the traces $70_3$, $70_6$ of pin pairs 3-6 (references $40_3$ and $40_6$) in a region 90 on the PC board 44 indicated by the dashed box. However, in this second case the inductive loop is reversed.

Note that although the present illustrative embodiment describes a flexible PCB 44 having two conductive layers separated by a dielectric substrate, a person of ordinary skill in the art will understand that a multilayer PCB, wherein a plurality of conductive layers are separated by a plurality of dielectric substrates, could also be used.

Figure 5:
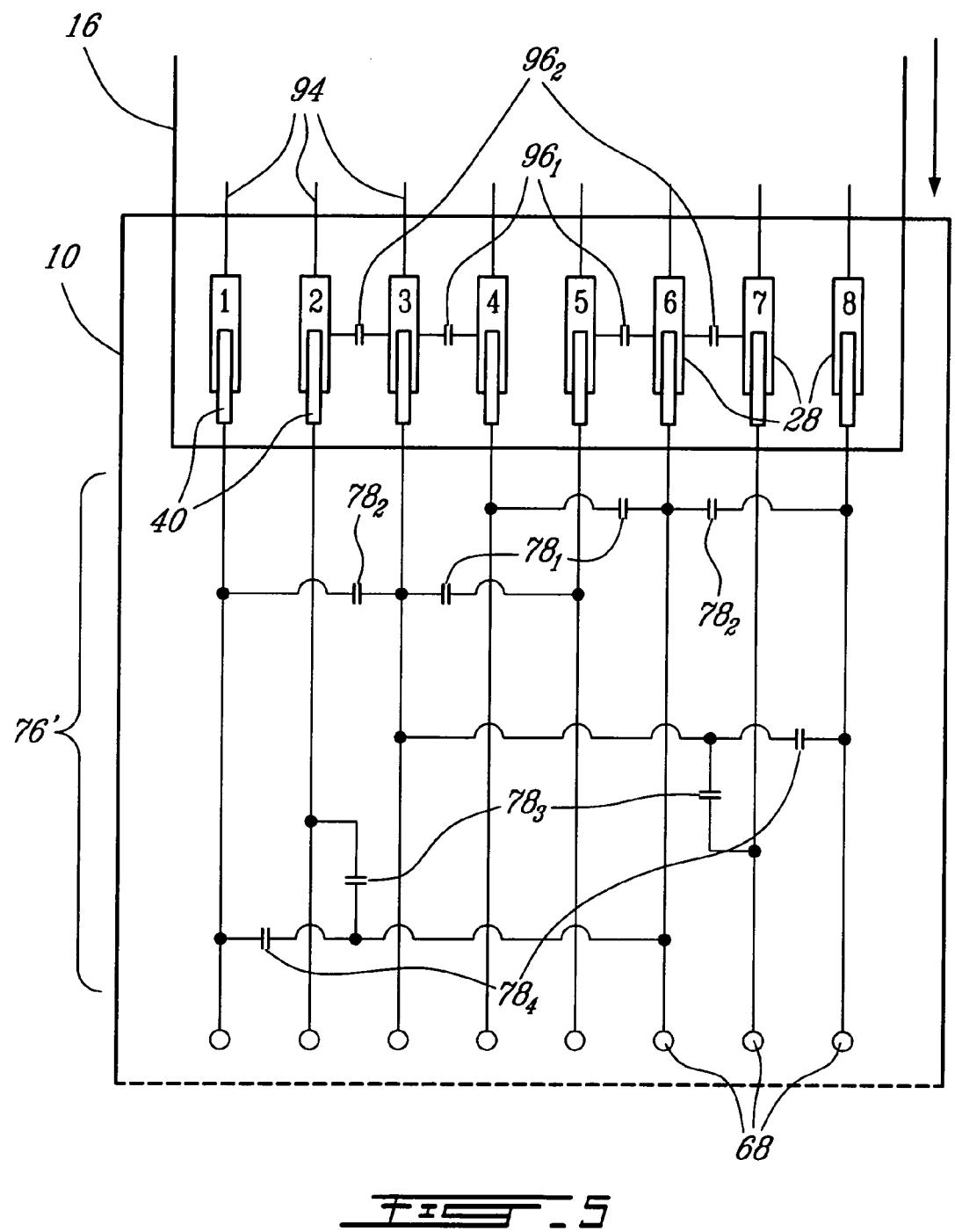
FIG. 5 provides a schematic view of a plug and compensating network in accordance with an illustrative embodiment of the present invention.

In connectors, cables and plug assemblies according to the RJ-45 specifications, eight (8) conductors are arranged in pairs which are twisted together to form the twisted pairs widely used in telecommunications systems. Referring now to FIG. 5, an RJ-45 plug can be modelled as a series of terminal contacts as in 92 terminating a series of conductors 94 and between which a series of parasitic capacitances as in 96 have been introduced. When the plug 16 is inserted into the connector 10, the series of terminal contacts as in 92 come into contact with the contact strips as in 40 which also form the first contact plates of the capacitive compensating elements 78. As discussed hereinabove, the compensating elements 78 are arranged as a compensating network 76 which is designed in a manner to compensate for, or balance, adverse effects which would otherwise be introduced by the parasitic capacitances 96. In this regard, and still referring to FIG. 5, illustratively the series of capacitive compensating elements designated $78_1$ are compensating for the differential parasitic capacitances 96. Additionally, a second series capacitive compensating elements (designated $78_2$, $78_3$ and $78_4$) can optionally be added to compensate for the common mode noise signal generated by the combination of the parasitic capacitances 96 and the compensating elements $78_1$. Note that other configurations of capacitive compensating elements is possible. Additionally, inductive compensating elements such as those described above can be used in combination with the capacitive compensating elements as described, with appropriate modifications to the compensating network 76.

To balance the connector 10/plug 16 interface, compensating (balancing) elements can be integrated into the connector 10 to form the compensation network 76 that will counter the introduced parasitic capacitances 96. Such a compensation network 76 can be fabricated from a combination of compensating elements as in 78 including, for example, one or more capacitive elements. In an illustrative embodiment all the compensating elements 78 are capacitors having a value between about 360±15 femtofarads. Necessarily, by placing the compensating elements as in 78 close to the point of introduction of the aforementioned parasitic capacitances 96 (i.e. at the point of contact between the terminal contacts 92 and the connector contact strips 40), the compensation can be improved (as time-shifted corrections to transferred signals are necessarily delayed from their point of necessity and thus produce unwanted perturbations in the corrected signals).

Figure 6:
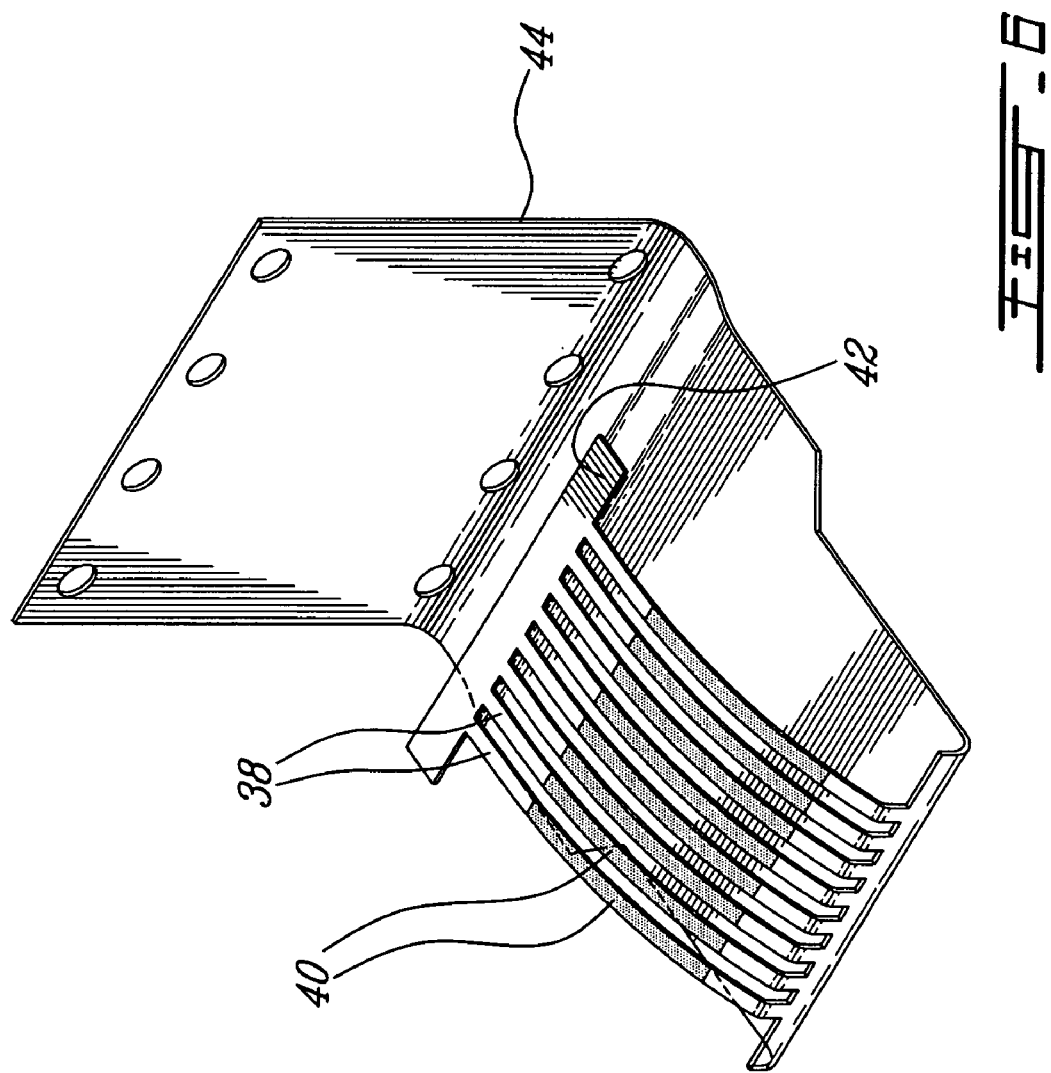
FIG. 6 provides a raised front perspective view of a flexible PCB in accordance with an illustrative embodiment of the present invention.
Figure 7:
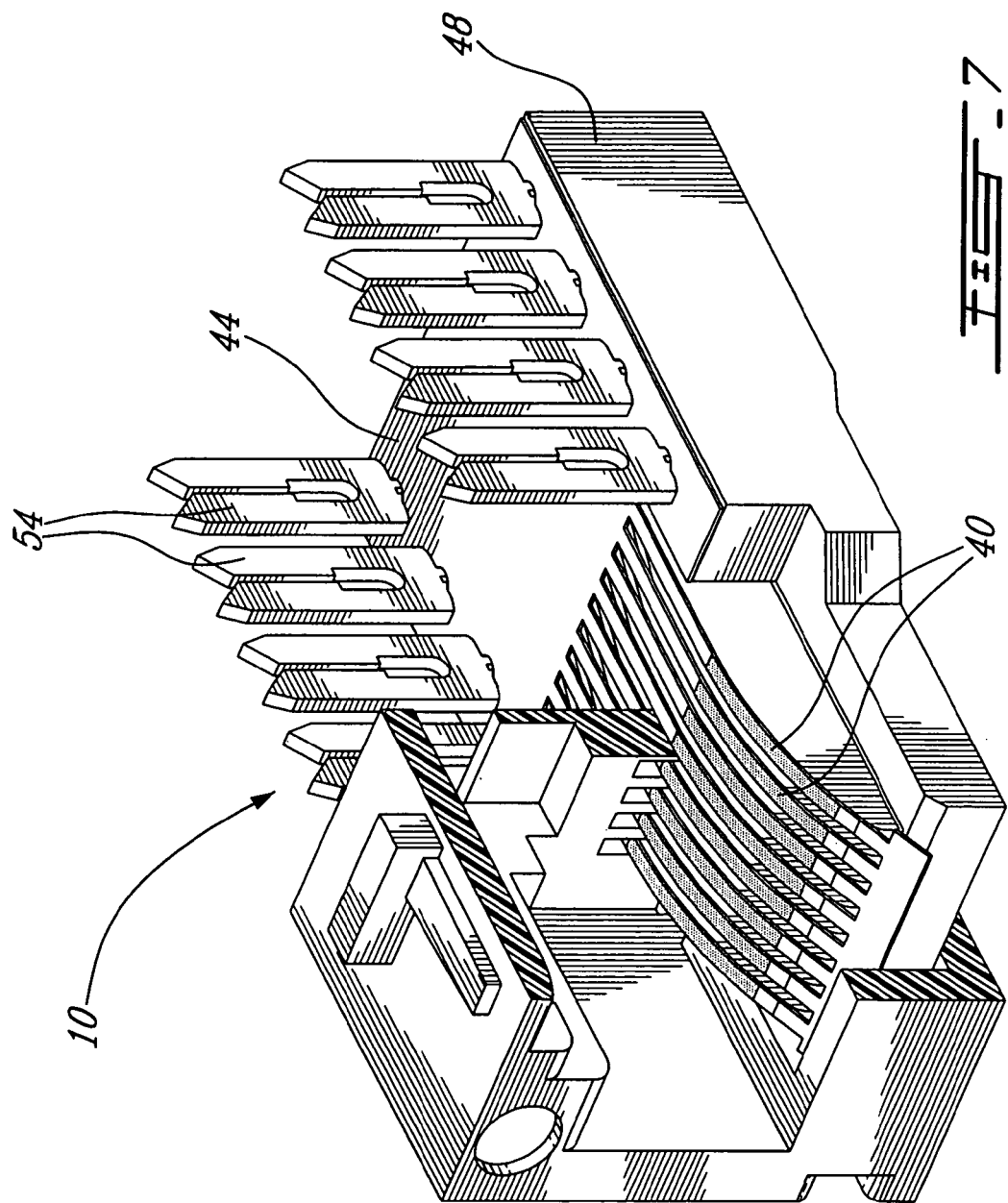
FIG. 7 provides a raised front perspective view of a support structure with a PCB attached in accordance with an alternative illustrative embodiment of the present invention.

Referring now to FIG. 6 in addition to FIG. 2, during assembly the PCB 44 is formed to fit the support structure 48. Referring now to FIG. 7, however, in an alternative construction of the support structure 48, a similar connector 10 can be assembled without significantly bending the PCB 44. This would allow the use, for example, of more rigid PCB constructions, for example those manufactured from thin sheets of FR4 epoxy laminate. The PCB 44 of FIG. 7 also has the advantage that the interconnecting traces (not shown) between the series of contacts 40 and the IDC terminals as in 54 are somewhat shortened.

Figure 8:
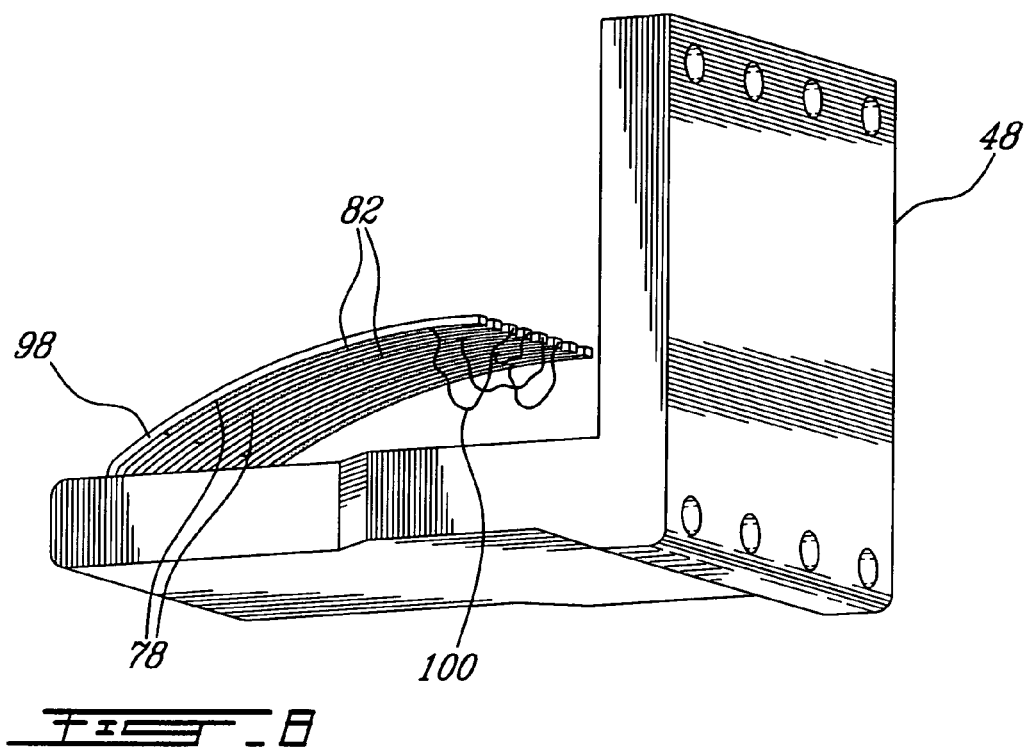
FIG. 8 provides a side perspective view (from below) of a contact assembly and compensating network in accordance with a second alternative illustrative embodiment of the present invention.

Referring to FIG. 8, in a second alternative embodiment, the non-conductive supporting blades as in 50 of FIG. 2 could be replaced by a series of metal tines 98. The tines 98 could be used to support the PCB 44 of FIGS. 4A and 4B with provision of a suitable isolating dielectric between the tines 98 and the PCB 44. Alternatively, the compensating elements, illustratively as in 78, can be formed directly on the tines 98, for example using a suitable non-conductive adhesive (not shown). In this regard, the tines 98 provide the first contact plate of the compensating elements 78, with provision of a suitable dielectric between the second contact plates 82 and the tines 98 (for example, a strip of dielectric material disposes between the surface of the tines 98 and second contact plate 82. The second contact plates 82 of the compensating elements 78 are interconnected with the first contact plates formed by the tines 98, illustratively using a series of small gauge wires as in 100, in order to form a compensating network.

Figure 9:
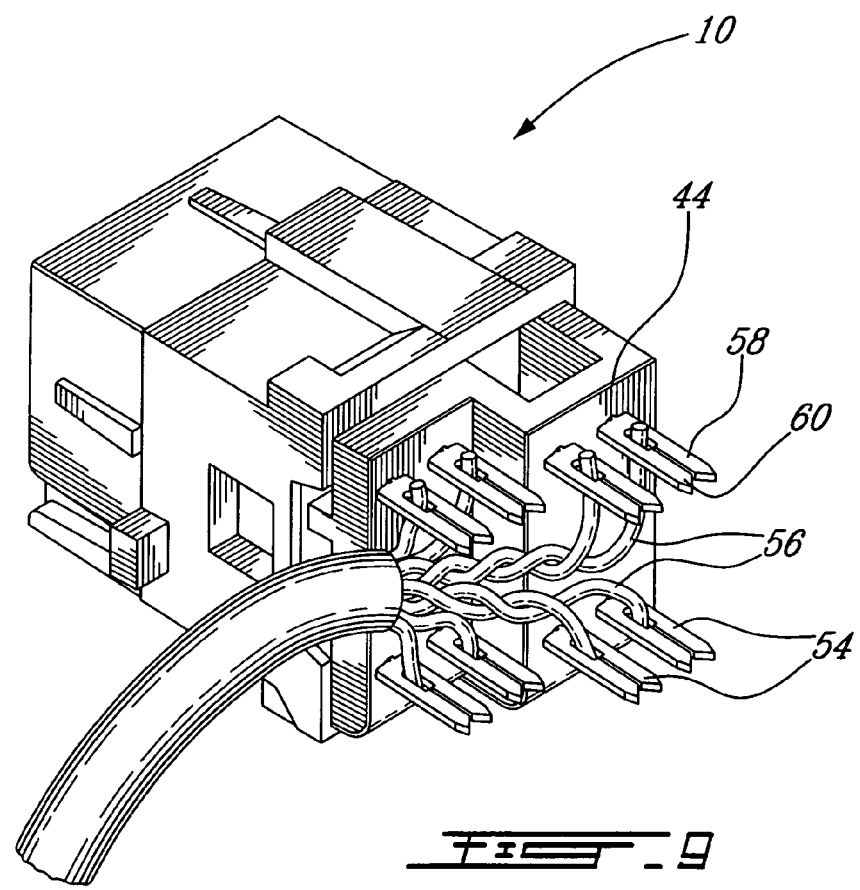
FIG. 9 provides a raised rear perspective view of a connector in accordance with a third illustrative embodiment of the present invention.

Referring now to FIG. 9, the use of a flexible PCB 44 also allows for variations in the manner in which the IDC terminals as in 54 are arranged without any significant modifications to the PCB 44. This allows, for example, for improved termination of the cable 102, for example by reducing the amount the individual wires 56 of the twisted pairs must be unwound prior to insertion of the wires 56 between the bifurcated conductive blades 58, 60 of the IDC terminals 54. Improvement of the interconnection between cable 102 and connector 10 in turn provides for improved performance.

Although the present invention has been described hereinabove by way of illustrative embodiments thereof, these embodiments can be modified at will without departing from the spirit and nature of the subject invention.

What is claimed is:

1. A contact mechanism for use in a connector, the connector comprising a socket adapted to receive a plug comprising a plurality of terminal contacts, the mechanism comprising:
    a flexible dielectric substrate;
    a plurality of elongate first conductive strips arranged in parallel and overlaid on a first surface of said substrate; and
    at least one elongate slot in said substrate, one of each of said slots separating each of said elongate first conductive strips;
    wherein when the plug is inserted into the socket, each of the terminal contacts comes into direct contact with a predetermined one of said conductive strips within a contact zone and further wherein a compensating element is positioned within said contact zone.

2. The mechanism of claim 1, wherein said flexible substrate is a flexible PC board.

3. The mechanism of claim 1, further comprising at least one second conductive strip on a second surface of said substrate.

4. The mechanism of claim 3, wherein said substrate between at least one of said first conductive strips and said at least one second conductive strips acts as a capacitor.

5. The mechanism of claim 1, further comprising a compensation network comprised of a plurality of compensating elements.

6. The mechanism of claim 5, wherein at least one of said compensating elements is capacitive.

7. The mechanism of claim 5, wherein at least one of said compensating elements is inductive.

8. The mechanism of claim 5, wherein said conductive strips are elongate and arranged in parallel.

9. The mechanism of claim 8, further comprising a slot in said flexible dielectric support between adjacent conductive strips.

10. A contact element for use in a compensating connector, the connector comprising a socket adapted for receiving a cable plug comprising a terminal contact, the contact element comprising:
    a dielectric support; and
    a compensating element comprising a conductive strip overlaid on a surface of said support;
    wherein when the plug is inserted into the socket, the terminal contact comes into direct contact with said conductive strip within a contact zone and further wherein said compensating element is positioned within said contact zone.

11. The contact element of claim 10, wherein said compensating element comprises a capacitor and an inductive loop, a contact plate of said capacitor comprising at least a portion of said conductive strip and at least a portion of said inductive loop comprising said conductive strip.

12. The contact element of claim 10, wherein said compensating element comprises a capacitor and wherein a contact plate of said capacitor comprises at least a portion of said conductive strip.

13. The contact element of claim 10, wherein said compensating element comprises an inductive loop and wherein at least a portion of said inductive loop comprises said conductive strip.

14. The contact element of claim 10, wherein said dielectric support is flexible.

15. The contact element of claim 14, wherein said flexible support is a flexible printed circuit board and said conductive strip is etched on said first surface.

16. A compensating connector for interconnection with a cable plug terminating a telecommunications cable comprised of a plurality of conductors arranged in pairs, the plug comprising a plurality of terminal contacts terminating a predetermined one of the conductors, the connector comprising:
    a socket adapted for receiving the plug;
    a plurality of contact elements disposed in said socket, each of said contact elements comprising a conductive strip; and
    a compensation network comprised of a plurality of compensating elements;
    wherein when the plug is inserted into said socket, each of the terminal contacts comes into direct contact with a predetermined one of said conductive strips within a contact zone and further wherein said compensating elements are positioned within said contact zone.

* * * * *